(12) United States Patent
Basol et al.

(10) Patent No.: US 7,204,743 B2
(45) Date of Patent: Apr. 17, 2007

(54) INTEGRATED CIRCUIT INTERCONNECT FABRICATION SYSTEMS

(75) Inventors: Bulent M. Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 37 days.

(21) Appl. No.: 10/703,293

(22) Filed: Nov. 7, 2003

(65) Prior Publication Data

US 2004/0132381 A1    Jul. 8, 2004

Related U.S. Application Data

(63) Continuation-in-part of application No. 09/795,687, filed on Feb. 27, 2001, now Pat. No. 6,953,392, and a continuation-in-part of application No. 10/264,726, filed on Oct. 3, 2002.

(60) Provisional application No. 60/426,539, filed on Nov. 15, 2002.

(51) Int. Cl.
  *B24B 7/22* (2006.01)
(52) U.S. Cl. .................. 451/67; 451/288; 451/339
(58) Field of Classification Search .............. 451/36, 451/37, 41, 54, 57, 59, 63, 65, 66, 67, 331, 451/339
  See application file for complete search history.

(56) References Cited

U.S. PATENT DOCUMENTS 5,679,059 A    10/1997    Nishi et al.
5,826,129 A    10/1998    Hasebe et al.
5,827,110 A    10/1998    Yajima et al.
5,830,045 A *  11/1998    Togawa et al. ............. 451/288
5,885,138 A    3/1999     Okumura et al.
5,954,072 A    9/1999     Matusita
5,972,110 A    10/1999    Akimoto
6,004,880 A *  12/1999    Liu et al. .................... 438/692
6,110,011 A    8/2000     Somekh et al.

(Continued)

FOREIGN PATENT DOCUMENTS

EP        0978867        2/2000

(Continued)

*Primary Examiner*—Timothy V. Eley
(74) *Attorney, Agent, or Firm*—Knobbe Martens Olson & Bear LLP

(57) ABSTRACT

A system for processing a conductive surface on a front surface of a wafer to form a metallic interconnect structure is disclosed. The system for processing comprises an electrochemical mechanical processing (ECMPR) module configured to form a substantially planarized conductive layer on the front surface of the wafer, a chamber within the ECMPR module configured to remove conductive material from an edge region of the wafer, a CMP module configured to receive the wafer from the ECMPR module and polish the planarized conductive layer on the surface of the wafer to form the metallic interconnect structure, and a robot configured to transfer the wafer from the ECMPR module to the chemical mechanical polish (CMP) module. In one aspect of the invention, the ECMPR module deposits conductive material on the front surface of the wafer. The ECMPR module removes at least a portion of the conductive layer from the front surface of the wafer. Advantages of the invention include improved control of deposited metal to improve device consistency and yield.

22 Claims, 6 Drawing Sheets

U.S. PATENT DOCUMENTS

| | | |
|---|---|---|
| 6,132,289 A | 10/2000 | Labunsky et al. |
| 6,136,163 A | 10/2000 | Cheung et al. |
| 6,402,925 B2 * | 6/2002 | Talieh .................... 205/222 |
| 6,409,576 B1 | 6/2002 | Oguri et al. |
| 6,468,022 B1 | 10/2002 | Whitcomb |
| 6,494,985 B1 * | 12/2002 | Sotozaki et al. ....... 156/345.12 |
| 6,578,853 B1 | 6/2003 | Treur et al. |
| 6,613,200 B2 * | 9/2003 | Li et al. .................... 204/198 |
| 6,656,842 B2 | 12/2003 | Li et al. |
| 6,709,970 B1 | 3/2004 | Park et al. |
| 6,857,838 B2 | 2/2005 | Kuroda |
| 6,979,625 B1 | 12/2005 | Woo et al. |

FOREIGN PATENT DOCUMENTS

| | | |
|---|---|---|
| EP | 1037263 | 9/2000 |

* cited by examiner

INTEGRATED CIRCUIT INTERCONNECT FABRICATION SYSTEMS

REFERENCE TO RELATED APPLICATIONS

This Application claims priority to U.S. Provisional No. 60/426,539 filed Nov. 15, 2002 and is a continuation in part of U.S. Ser. No. 09/795,687 filed Feb. 27, 2001 (NT-202), now U.S. Patent No. 6,953,392, and U.S. Ser. No. 10/264,726 filed Oct. 3, 2002 (NT-224), all incorporated herein by reference.

FIELD

The present invention relates to manufacture of semiconductor integrated circuits and more particularly to a method of forming conductive interconnect structures.

BACKGROUND

Conventional semiconductor devices generally include a semiconductor substrate, usually a silicon substrate, and a plurality of sequentially formed dielectric layers such as silicon dioxide or low-k materials and conductive paths or interconnects made of conductive materials. Copper and copper alloys have recently received considerable attention as interconnect materials because of their superior electromigration characteristics and low resistivity. Interconnects are usually formed by filling copper, by a metallization process, into features or cavities etched into the dielectric layers. The preferred method of copper deposition is electroplating. In an integrated circuit, multiple levels of interconnect networks laterally extend with respect to the substrate surface. Interconnects formed in these stacked dielectric layers can be electrically connected using vias or contacts which may extend from one layer to the other.

In a typical interconnect formation process, first an insulating interlayer is formed on the semiconductor substrate. Patterning and etching processes are performed to form features such as trenches and vias in the insulating layer. Then, thin barrier and copper seed layers are deposited and copper is electroplated to fill the features. Once the plating is over, a chemical mechanical polishing (CMP) step is conducted to remove the excess portions of the copper and barrier layers that are at the top surface of the substrate, leaving conductors only in the features. This way an interconnect structure of copper is formed. These processes are repeated multiple times to manufacture multi-layer interconnects.

An exemplary prior art process can be briefly described with the help of FIGS. 1A and 1B. FIG. 1A shows a substrate 8 which is processed to form an exemplary dual damascene interconnect structure shown in FIG. 1B. In this structure, a via 10 and a trench 12 are first formed in a dielectric layer 14 on the substrate 8, and then filled with copper 16 through electroplating process. Conventionally, after patterning and etching, which form the cavities such as vias and trenches, the dielectric layer 14 is first coated with a barrier layer 18, for example, a Ta/TaN composite layer. The barrier layer 18 coats the dielectric layer to ensure good adhesion and acts as a barrier material to prevent diffusion of the copper into the dielectric layers and into the semiconductor devices. Next, a seed layer (not shown), which is often a copper layer, is deposited on the barrier layer. The seed layer forms a conductive material base for copper film growth during the subsequent copper deposition. As the copper film is electroplated, the copper 16 quickly fills the small via 10 but coats the wide trench and the surface in a conformal manner. When the deposition process is continued, the trench is also filled with copper, but a thick overburden layer 't' is formed over the top surface and a step 's' is formed over the large trench. The excess copper, or overburden needs to be removed from the top surface for the formation of interconnect structure. Removal of such a thick copper layer from the surface presents a problem during the CMP step, which is expensive and time consuming. As shown in FIG. 1B, during the CMP removal of the thick copper layer and then the barrier layer from the top surface, a non-planar surface 20 may be formed of the copper left in the trench. Such non-planar surfaces may form due to the difference in polishing rates between the barrier layer and the copper, or other reasons. The non-planar surface 20, or so-called "dishing effect", adversely affects the quality of the subsequently deposited layers and the resistance of the line formed by the trench 12.

Some prior art processes attempt to minimize or eliminate the dishing effect by employing multiple CMP steps with different slurries and polishing pads. For example, in one particular prior art process, at a first CMP process step, the bulk copper layer on the substrate is removed down to an initial thickness that is over the barrier layer. The first step is performed in a first CMP station. A second step is performed in a second CMP station to expose a portion of the barrier layer that overlies the dielectric layer. In a third step, the portion of the barrier layer that overlies the insulating layer is removed. The third step is performed in a third CMP station.

In another approach, a first CMP step utilizes selective slurry to remove all of the copper from the top surface region. Then a second CMP step employing non-selective slurry is used to remove the barrier from the top surface, at the same time removing some copper from the features and some of the dielectric. This way dishing is reduced, however, since some copper is lost from the features, resistance of the interconnect lines is increased.

In such prior art processes, multiple CMP steps carried out at multiple CMP stations using multiple consumable sets increase the production time and cost. To this end, there is a need for an alternative, lower cost method of removing overburden conductor off the surface of plated substrates.

SUMMARY

The invention provides an apparatus, system, and method of processing a wafer having a conductive surface in a wafer processing system. A method for processing a front surface of a wafer is disclosed. The method comprises electrochemically mechanically processing the conductive surface of the wafer to form a substantially planarized conductive layer in an electrochemical mechanical processing (ECMPR) module, removing additional conductive material from an edge region of the wafer, chemically mechanically polishing the conductive layer in a chemical mechanical polish (CMP) module to form a metallic interconnect structure on the wafer.

In one aspect of the invention, the electrochemically mechanically processing step includes depositing a conductive material over the conductive surface.

In another aspect of the invention, the electrochemically mechanically processing step includes removing the conductive layer.

In another aspect of the invention, the chemically mechanically polishing step includes removing at least a portion of the conductive surface.

Advantages of the invention include improved control of deposited metal to improve device consistency and yield.

DRAWINGS

The invention is described in detail with reference to the drawings, in which.

DETAILED DESCRIPTION

Reference will now be made to the drawings wherein like numerals refer to like parts throughout. Electrochemical Mechanical Processing (ECMPR) is a new approach for processing conductive layers for interconnect applications. ECMPR has the ability to provide thin films of planar conductive materials on the patterned workpiece surface, or even provide a workpiece surface with no overburden or excess conductive material. The term "Electrochemical Mechanical Processing (ECMPR)" is used to include both Electrochemical Mechanical Deposition (ECMD) processes as well as Electrochemical Mechanical Etching (ECME), also called Electrochemical Mechanical Polishing (ECMP). It should be noted that, in general, both ECMD and ECME processes are referred to as ECMPR since both involve electrochemical processes (electrochemical deposition and electrochemical etching) and mechanical action.

Figure 1A:
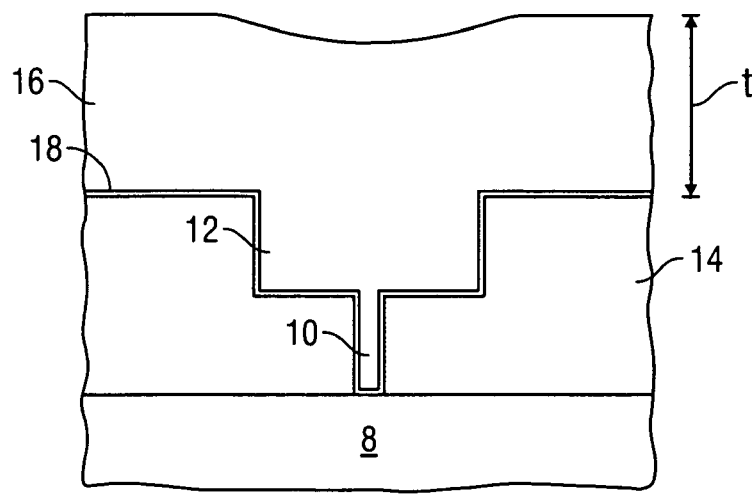
FIG. 1A depicts formation of an exemplary dual damascene interconnect structure.
Figure 1B:
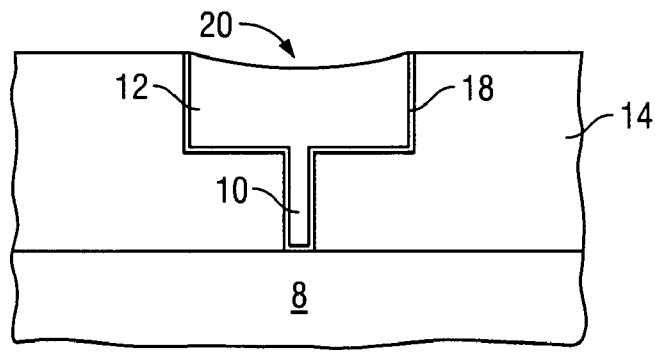
FIG. 1B depicts the exemplary dual damascene having a non planar surface.
Figure 1C:
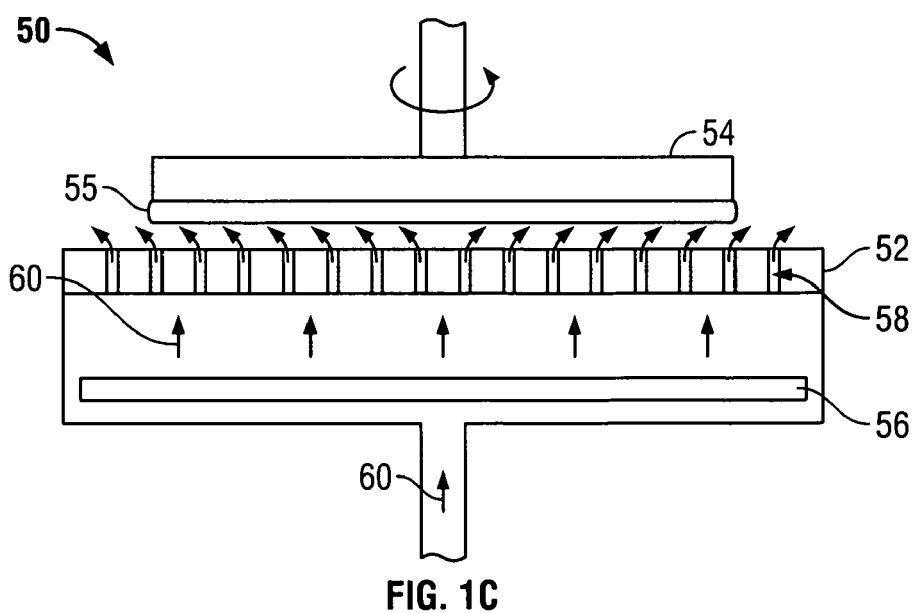
FIG. 1C depicts an exemplary electrochemical mechanical processing system according to an embodiment of the present invention.

FIG. 1C shows an exemplary ECMPR system 50, which includes a workpiece-surface-influencing device (WSID) 52 such as a mask, pad or a sweeper, a carrier head 54 holding a workpiece 55 and an electrode 56. Other conventional ECMPR systems include those that have reverse geometry, i.e. WSID is above the workpiece and the workpiece surface faces up. There are also designs with belt-shaped WSIDs.

During ECMD or ECME processes, the WSID 52 may be held in close proximity of the workpiece surface, i.e., no-touch processing. However, part of the time WSID mechanically sweeps the surface of the workpiece, i.e. touch-processing, while a relative motion is established between the workpiece surface and the WSID.

Surface of the WSID 52 sweeps the surface of the workpiece 55 while an electrical potential is established between the electrode 56 and the surface of the workpiece during touch-processing. Channels 58 of the WSID 52 allow a process solution 60 to flow to the surface of the workpiece 55. If the ECMD process is carried out, the surface of the workpiece 55 is wetted by a deposition solution, which is also in fluid contact with the electrode 56 and a potential is applied between the surface of the workpiece and the electrode rendering the workpiece surface cathodic. In other designs of ECMPR apparatus, the process solution may be fed onto the WSID rather than through it.

If the ECME process is carried out, the surface of the workpiece may be wetted by the deposition solution or a special electroetching solution, which is also in fluid contact with an electrode. A potential is then applied between the surface of the workpiece and the electrode rendering the workpiece surface anodic. Thus, electroetching takes place on the workpiece surface. Very thin planar deposits can be obtained by first depositing a planar layer using an ECMD technique and then using an ECME technique on the planar film in the same deposition apparatus and deposition solution by reversing the applied voltage. Alternately, the ECME step can be carried out in the deposition apparatus, but an electroetching solution different from the deposition solution used for the ECMD step may be fed into the apparatus during the ECME step. In another alternative approach the ECME process may be carried out in an apparatus, which is separated from the one ECMD step is carried out, i.e. wafer needs to be transferred to the ECME apparatus from the ECMD apparatus.

ECME technique may branch out into a family of processes, depending on use of touch or no-touch processes. For example, if ECME is performed using a non-touch approach, the mechanical component of the electrochemical mechanical etching process is eliminated and as a result material removal is performed only electrochemically. This process is referred to as electrochemical etching ECE. Electrochemical etching electrolytes are typically chosen to have a leveling capability. Such electrolytes are used in processes at high current densities to yield smooth surfaces. Therefore, ECE is also called electrochemical polishing or ECP. Further, if etching is performed in touch mode but with no voltage applied between the electrode and the substrate surface, the process is chemical mechanical etching (CME). Like wise, if the etching is performed in the no-touch mode and without applied voltage, the process is solely chemical etching, CE. As indicated before, ECME may be performed either in an electroetching solution or in a deposition solution. Electroetching solutions are also called electropolishing solutions and they are specially formulated to yield a smooth surface of the electroetched material. Chemical etching rate of the material is small in the electroetching solutions. The rate becomes high once electrochemical process is initiated i.e. voltage is applied. Deposition solutions are formulated for material deposition. However, as explained before, they can be used for electroetching in cases when electroetching is carried out right after electrodeposition, in the same apparatus. Obviously, this is a low cost alternative and an example of it is described in U.S. Ser. No. 09/671,800 filed Sep. 28, 2000, entitled Method to Minimize/Eliminate Metal Coating Over the Top Surface of a Patterned Substrate and Layer Structure Made Thereby, which is commonly owned by the assignee of the present invention.

Descriptions of electrochemical mechanical deposition and etching methods, i.e. ECMPR, can be found in various patents and pending applications, all commonly owned by the assignee of the present invention. U.S. Pat. No. 6,176, 992, entitled, "Method and Apparatus for Electro-chemical Mechanical Deposition," U.S. application Ser. No. 09/740, 701, now U.S. Pat. No. 6,534,116, entitled, "Plating Method and Apparatus that Creates a Differential Between Additive Disposed on a Top Surface and a Cavity Surface of a Workpiece Using an External Influence," filed on Dec. 18, 2001, and U.S. Application filed on Sep. 20, 2001 with Ser. No. 09/961,193, now U.S. Pat. No. 6,921,551, entitled, "Plating Method and Apparatus for Controlling Deposition on Predetermined Portions of a Workpiece" are patents and applications describing various ECMPR approaches. Electrochemical mechanical processes can deposit metals in and over cavity sections on a patterned workpiece surface in a planar manner. They also have the capability of yielding novel structures with excess amount of metals selectively over the features irrespective of their size, if desired. A system that can be adapted to perform the processes of the present invention is discussed in U.S. Utility application Ser. No. 09/795,687, now U.S. Pat. No. 6,953,392, entitled, "Integrated System for Processing Semiconductor Wafers", which was filed on Feb. 27, 2001 and based on priority provisional application 60/259,676 filed Jan. 5, 2001 and 60/261,263 filed Jan. 16, 2001. Some process systems and methods are also disclosed in U.S. Ser. No. 10/264,726 filed Oct. 3, 2002, entitled, "Fabrication of Semiconductor Interconnect Structures, which is commonly owned by the assignee of the present invention."

As will be described below, the present invention provides a method and a system for manufacturing interconnects for semiconductor integrated circuits. The method is especially useful to form interconnects that include trenches and other features with widths larger than 1 micron. As shown in FIG. 1A, standard plating techniques cause a step 's' over such wide features and standard material removal approaches, such as CMP, cause dishing 20, as shown in FIG. 1B. In one embodiment, the present invention employs a planar deposition process, such as electrochemical mechanical deposition (ECMD) process and chemical mechanical polishing process (CMP) to form copper interconnects. In this embodiment, for example, a planar copper layer is initially formed by an ECMD process step which is subsequently removed by carrying out two separate CMP process steps to produce the final interconnect structure. In another embodiment, an initial ECMD process step is used to form a planar layer that is thinner than the layer formed in the first embodiment. This thin planar layer along with the barrier are then removed using a single CMP step to form the final interconnect structure.

In connection with the above embodiments, the present invention also provides integration of electrochemical etching processes to remove conductive layers that are deposited by conventional plating or planar plating processes, planar plating processes being preferable. Integration of edge copper removal, wafer backside cleaning and annealing into the systems may also be achieved.

The CMP process conventionally involves pressing a semiconductor wafer or other such substrate against a moving polishing surface that is wetted with a chemically reactive abrasive slurry. The slurries are usually either basic or acidic and generally contain alumina, ceria, silica or other hard ceramic particles. The polishing surface is typically a pad made of polymeric materials well known in the art of CMP. The pad itself may also be an abrasive pad. During a CMP process, a wafer carrier with a wafer to be processed is placed on a CMP pad and pressed against it. The pad, which may be an abrasive pad, may be moved laterally as a linear belt or may be rotated. The process is performed by moving the wafer against the pad or the linear belt in a CMP slurry solution flowing between the pad and the wafer surface. The slurry may be any of the known CMP slurries in the art, and may be flowed over the pad or may be flowed through the pad if the pad is porous in the latter case.

Figure 2:
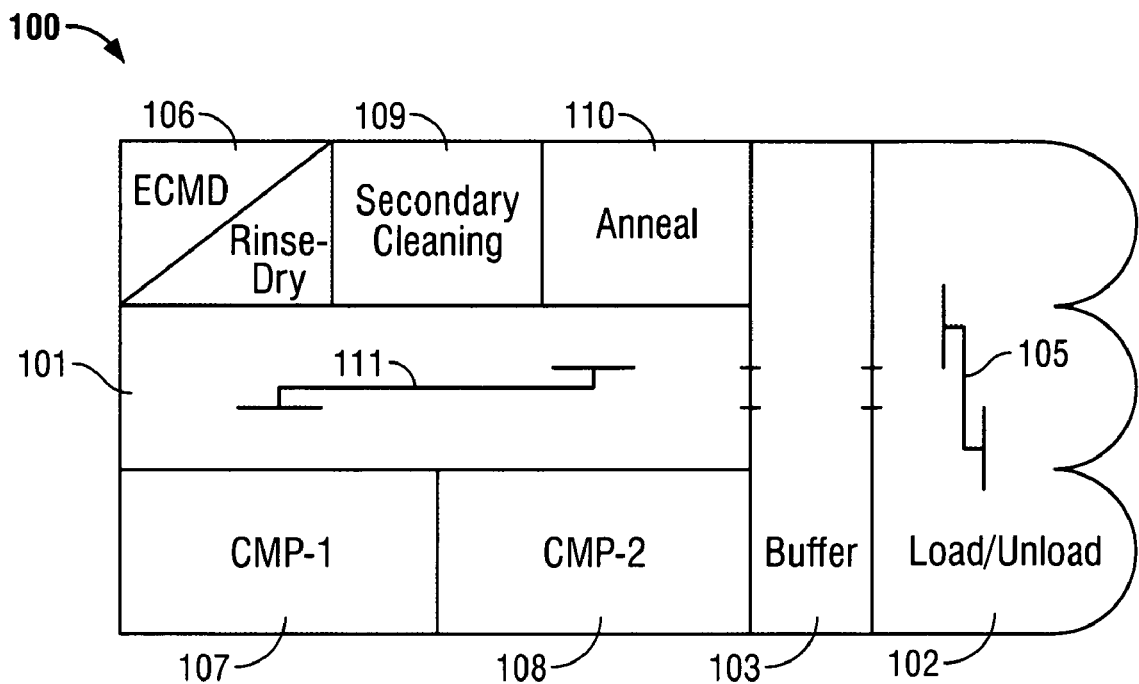
FIG. 2 depicts an exemplary processing system according to an embodiment of the present invention.

FIG. 2 shows a first system 100 of the present invention. The first system 100 comprises a processing section 101, a load-unload section 102 and a buffer section 103 that is located between the processing section and the load unload sections. The wafers are loaded into load-unload section 102 and a first robot 105 located in the load unload section 102 delivers them to, or picks up from, the processing section via the buffer section 103. In one embodiment, the processing section may have a process station 106, a first CMP station 107, a second CMP station 108, a secondary cleaning station 109 and an annealing station 110. A second robot 111 is used to deliver, or pick up, wafers in the processing section. In this example, the process station may be used to perform a planar electrodeposition process such as ECMD. Although, in this example, stations are shown as an integrated part of the first system 100, they may also be individual stations that are located separately. Furthermore, more ECMD, CMP, anneal or secondary cleaning stations may be included in the system to increase its throughput. It should be noted that in this embodiment, preferably, the chambers are vertically stacked chambers including a lower process chamber (such as an ECMD chamber) and a top rinsing and drying chamber. One such exemplary vertical chamber design and operation is disclosed in the U.S. Pat. No. 6,352,623, entitled "Vertically Configured Chamber Used for Multiple Processes," filed Dec. 17, 1999, commonly owned by the assignee of the present invention. Accordingly, in this embodiment, the process chamber 106 has a bottom ECMD process chamber and an upper rinsing and drying chamber. In the upper chamber edge copper removal and subsequent cleaning can be also performed.

A wafer can be transferred to the process station 106 in the processing section 101 to initiate the process such as ECMD. The stations 106–110 can be adapted to either process 200 or 300-millimeter wafers. The anneal station is used to anneal the wafers before or after the CMP processes, or before and after the CMP process. Wafer front and back surfaces may be further cleaned in the secondary cleaning chamber to remove possible contaminants from these surfaces after the wafers are rinsed and dried in the process station.

Figure 3A:
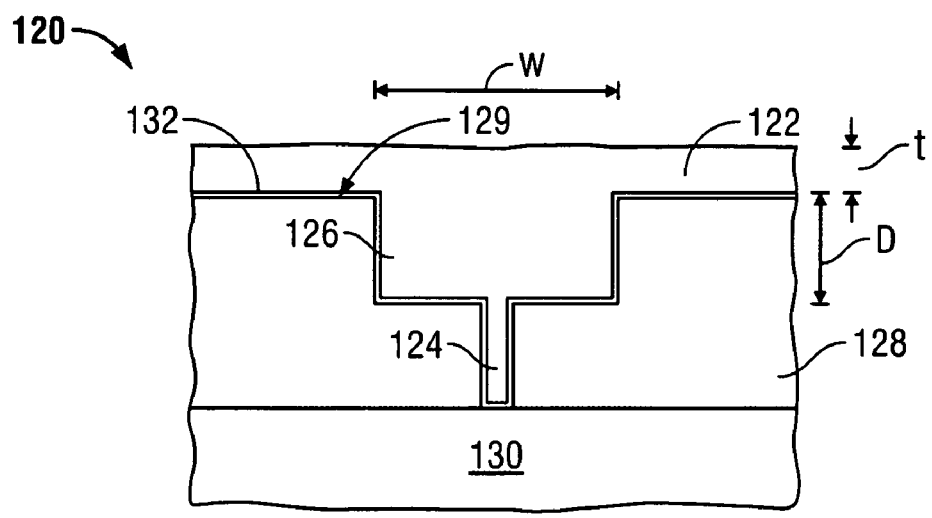
FIGS. 3A–3C depicts cross-sectional views of a substrate in the formation of an interconnect according to an embodiment of the present invention.
Figure 3B:
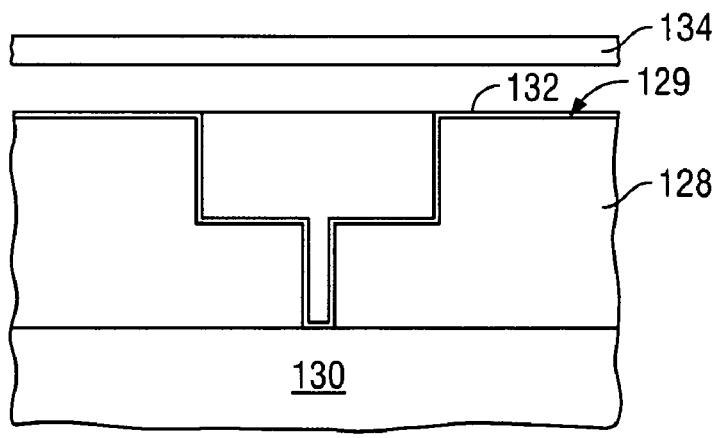
Figure 3C:
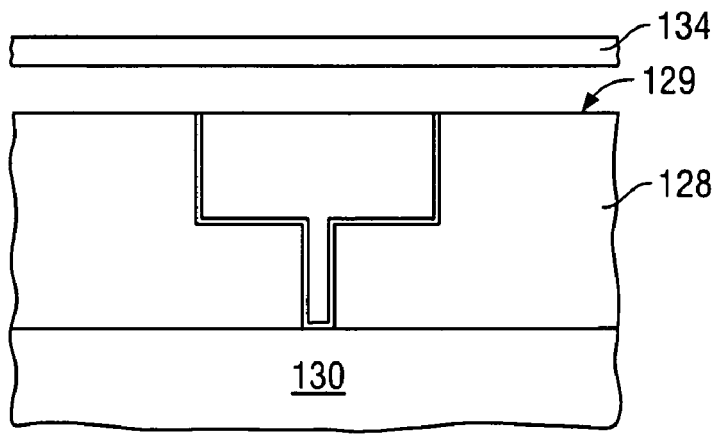

FIGS. 3A–3C are schematic cross-sectional views exemplifying the process of the present invention to form a copper interconnect using a three step process of the present invention and the system shown in FIG. 2. In this example, an exemplary dual damascene interconnect structure will be formed by a three step deposition-polishing process which includes the steps of first depositing a thin planar layer using ECMD and then removing this layer using a two step CMP process. Referring to FIG. 2, in this embodiment ECMD process is performed in the process station 106. Although copper is used as an example material that is deposited and/or removed herein, the present invention may be used when depositing or removing other conductors, for example Ni, Pd, Pt, Au, Pb, Sn, Ag, Co and their alloys. FIG. 3A shows a semiconductor substrate 120 having a planar copper layer 122 formed in a deposition step of the present invention, which employs an ECMD process. In the process station 106 shown in FIG. 2, the planar layer 122 is electroplated into a via 124 and a trench 126 which are patterned and etched into an insulating layer 128. The insulating layer 128 has a top surface 129 and is formed on a semiconductor wafer 130. A barrier layer 132 rather conformally coats the via 124, the trench 126 and the top surface 129 of insulating layer 128. A copper seed layer (not shown) is deposited on the barrier layer 132 and forms the base on which copper is electroplated. The thickness of a portion of the flat copper layer 122 that overlies the top surface 129 of the insulator 128 is related to the depth of the largest feature, i.e., the feature with the largest width, to be filled on the substrate 130, which is in this example the trench 126. If the width of the trench 126 which is denoted by 'W' is the largest on the substrate, the thickness 't' of the flat copper portion that overlies the top surface 129 may be equal to or less than 0.75 D, where 'D' is the depth of the trench. However, it is understood that if there is a larger, i.e., wider feature, on the entire wafer surface, thickness t will be a function of the depth of that larger feature, i.e., it would be less than or equal to about three quarters of the depth of that largest feature. It should be noted that in the prior art process (see FIG. 1A), the thickness of the copper overburden is larger than D, i.e., t>D. Such thin and flat copper layer can be produced by planar deposition techniques such as ECMD process that advantageously eliminates the use of a long and expensive conventional step of removing overburden or the excess copper from the surface of the substrate. The process station 106 then rinses and dries the wafer to send to the first CMP station 107.

As shown in FIG. 3B, in a polishing step following the deposition step, a first CMP process step is performed in the first CMP station to polish away the excess flat copper layer, in a planar manner, that overlies barrier layer on the top surface 129 of the insulating layer 128. The first CMP process step can preferably be performed using a fixed abrasive pad 134 with an abrasive-free slurry. The fixed abrasive pad 134 selectively removes the copper layer 122 down to the barrier layer. The first CMP station 106 then rinses and dries the substrate and transfers to the second CMP station 108.

As shown in FIG. 3C, a second and final polishing step is performed in the second CMP station, the barrier layer 132 overlying the top surface 129 of the insulating layer 128 is removed, for example with a slurry based CMP process using a non-abrasive pad 136. Removal of copper and barrier layers using different polishing pad and slurries is disclosed in U.S. Provisional Application No. 60/365,001, entitled "Method and Apparatus for Integrated Chemical Mechanical Polishing of Copper and Barrier Layers," filed Mar. 13, 2002 and now abandoned, commonly owned by the assignee of the present invention.

In another process sequence in the same system, the annealing step may be applied after the ECMD step and before the CMP step. After the ECMD step and following rinsing and drying, the wafer can be further cleaned in the secondary cleaning station to assure that back side and bevel of the wafer is free of copper. As stated earlier copper concentration needs to be lower than 10E11 atoms/cm2. Annealing before the CMP step in this process assures that copper grain size is larger and stabilized since copper thickness is larger. Alternatively, in yet another process sequence, the annealing step may be performed twice. The first annealing step is performed before the first CMP step and the second annealing is performed after the second CMP step. As in the previous embodiments, the secondary cleaning step may be performed after the rinsing and drying steps that follow the ECMD step, and also before any annealing step to assure that annealing does not cause any copper diffusion from the bevel and back surface of the wafer into the devices on the wafer.

Further, in another process sequence, The ECMD process may be performed in no-touch mode to obtain a non-planar copper layer. After cleaning and an anneal step in the anneal station, the deposition process may continue with a touch-ECMD process to obtain a planar copper layer. The wafer may then be subjected to CMP steps with or without an additional annealing step at the end as described before.

Figure 4A:
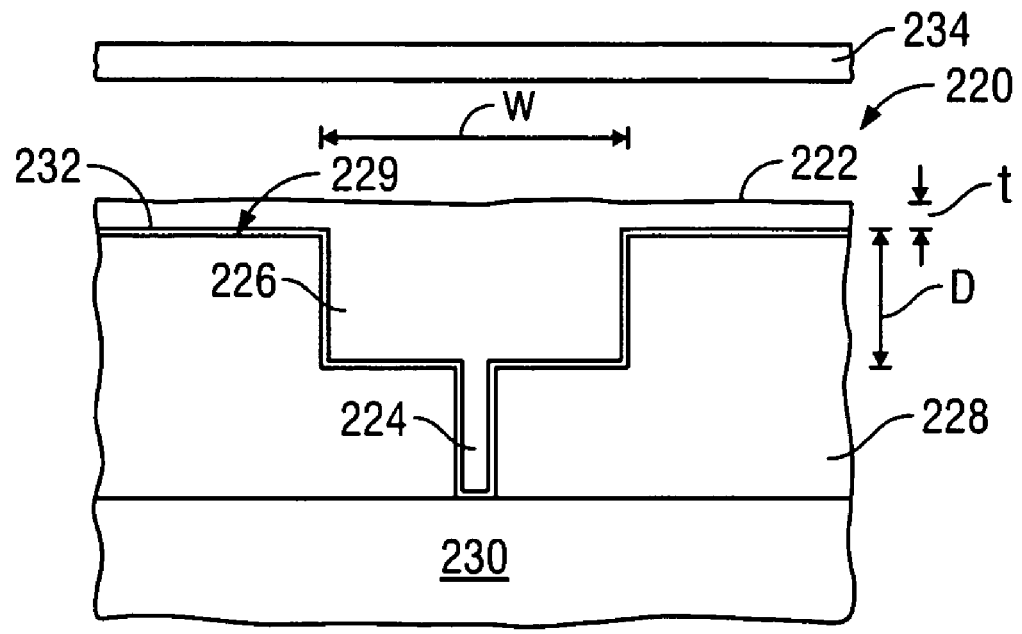
FIG. 4A depicts a substrate having a thin planar layer of metal on the surface of the substrate.
Figure 4B:
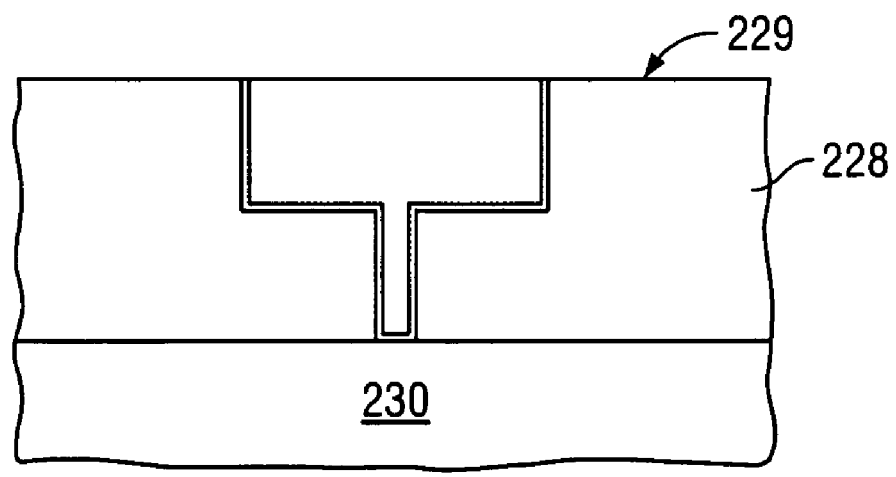
FIG. 4B depicts a completed substrate after the metal layer and the barrier layer have been polished away according to an embodiment of the present invention.

If the planar copper layer is thin enough, i.e., less than approximately 2000 Angstroms (Å), the above process may be performed with a single CMP step performed in one of the CMP stations 107, 108. The single CMP step removes the thin copper layer and underlying barrier layer using a non-selective slurry. As it will be appreciated, the CMP station used in this embodiment is reconfigured to perform single process step. FIGS. 4A and 4B are schematic cross-sectional views exemplifying the process of the present invention to form a copper interconnect using the system shown in FIG. 2. In this embodiment, a dual damascene structure will be formed in accordance with the principles of the present invention.

FIG. 4A shows a semiconductor substrate 220 having a thin planar copper layer 222 formed in a first step of the present invention. In the processing station 204 shown in FIG. 2, the planar layer is electroplated into a via 224 and a trench 226 which are patterned and etched into an insulating layer 228. In this embodiment, the thickness of a portion of the flat copper layer 222 that overlies the top surface 229 of the insulator 228, is less than or equal to 2000 Å, preferably, less than 1000 Å. Such thin and flat copper layer produced by the ECMD process advantageously eliminates the use of long and expensive conventional steps of removing overburden. After the ECMD process, the wafer is rinsed and dried in the same process station, and is sent to, for example, the first CMP station 107 (see FIG. 2).

As shown in FIG. 4B, in the final step of the present invention, a CMP process is performed to polish away the excess flat copper layer and the barrier layer, in a single polishing step. As mentioned before the first CMP station 107 is reconfigured to perform single step process. The pad 234 removes the copper layer 222 and the barrier layer 232 down to the top surface 229 of the interconnect 228 with the help of a slurry. Ultimately, a metallic interconnect is formed, thereby forming a complete dual damascene structure. A non-selective slurry may also be used in this step to remove a small thickness of the insulator or dielectric layer, thereby minimizing dishing effects. It should be noted that although the present invention is described using the ECMD process, it is also applicable to any planar deposition process that can yield thin layers. As in the previous embodiments, following the single step CMP, the wafer may be annealed in the anneal station. Before the anneal, it is preferable to clean the wafer one more time in the secondary cleaning station 109. After the annealing step, the wafer is taken to load-unload section to stack in cassettes.

In another process sequence in the same system, the annealing step may be applied before the CMP step and after the ECMD process step. Further, after the ECMD step, the wafer can be cleaned in the secondary cleaning station, after it is rinsed and dried in the processing station. Alternatively, in yet another embodiment, the annealing step may be performed twice, once before and once after the CMP step. As in the previous embodiments, also in this approach, the secondary cleaning step may be performed before each anneal step.

Further, in another process sequence, The ECMD process may be performed in no-touch mode to obtain a non-planar copper layer. After an anneal step in the anneal station, the deposition process may continue with a touch-ECMD process to obtain a planar copper layer. The wafer may be cleaned in the secondary cleaning station after each deposition process. The planar layer is then polished using the single step CMP process.

In all the above embodiments, it should be noted that edge copper removal step which removes copper from the front edge, bevel and back edge of the wafer may be carried out after the ECMD or plating steps. This process is preferably carried out in the rinse-dry section of the ECMD station, although it may also be performed in the secondary cleaning station. In cases when two different copper deposition steps are used in the process, copper on the front edge is removed only after the second deposition step because this copper is needed to make contact to for the second deposition step. However, the backside edge and bevel need to be cleaned after the first plating step and before any annealing step to avoid diffusion of copper from the backside and bevel to areas where devices are fabricated.

As described in the above embodiments and shown FIGS. 3A and 4A, initial planar copper structures 122 and 222 are formed using ECMD process. The same structures may also be manufactured by utilizing an electrochemical mechanical etching (ECME) or regular electropolishing steps after an ECMD step that deposits a thick planar copper layer. Once the copper layer is thinned down by an electropolishing process, one step or two step CMP processes, which are described above, can be performed to remove the excess copper layer.

Figure 5:
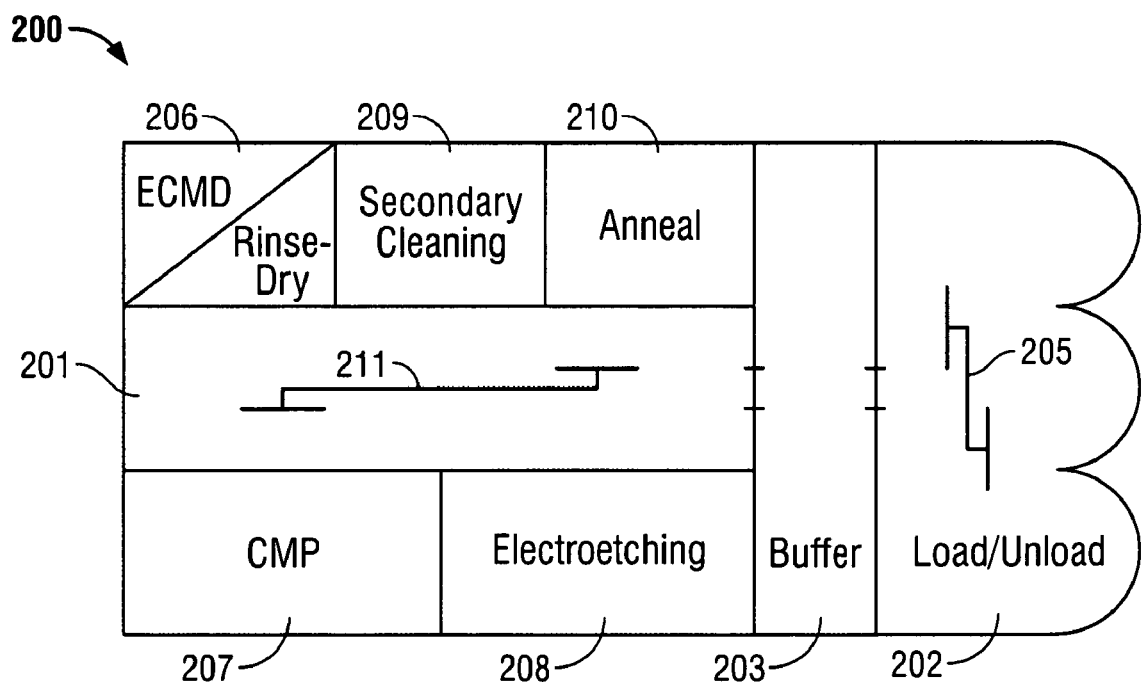
FIG. 5 depicts another exemplary electrochemical mechanical processing system according to an embodiment of the present invention.

The above process may be performed in an exemplary second system 200 shown in FIG. 5. The second system 200 may also comprise a processing section 201, a load-unload section 202 and a buffer section 203 that is located between the processing section and the load unload sections. The wafers are loaded into load-unload section 202 and a first robot 205 located in the load unload section 203 delivers them to, or picks up from, the processing section via the buffer section 203. In one embodiment, the processing section 201 may have a process station 206, a first CMP station 207, an electropolishing or electroetching station 208, a secondary cleaning station 209 and an annealing station 210. A second robot 211 is used to deliver, or pick up, wafers in the processing section. In this example, the process station may be used to perform a planar electrodeposition process such as ECMD. Although, in this example, stations are shown as an integrated part of the second system 200, they may be individual stations that are located separately. Furthermore, more ECMD, CMP, electropolish, annealing and cleaning stations may be included in the system to increase its throughput. It should be noted that in this embodiment, preferably, the chambers are vertically stacked chambers including a lower process chamber (such as an ECMD chamber) and a top rinsing and drying chamber, as disclosed in the above mentioned U.S. Pat. No. 6,352,623. Accordingly, in this embodiment, the process chamber 206 has a bottom ECMD process chamber and an upper rinsing and drying chamber. In the upper chamber edge copper removal and subsequent cleaning can be also performed.

Figure 6A:
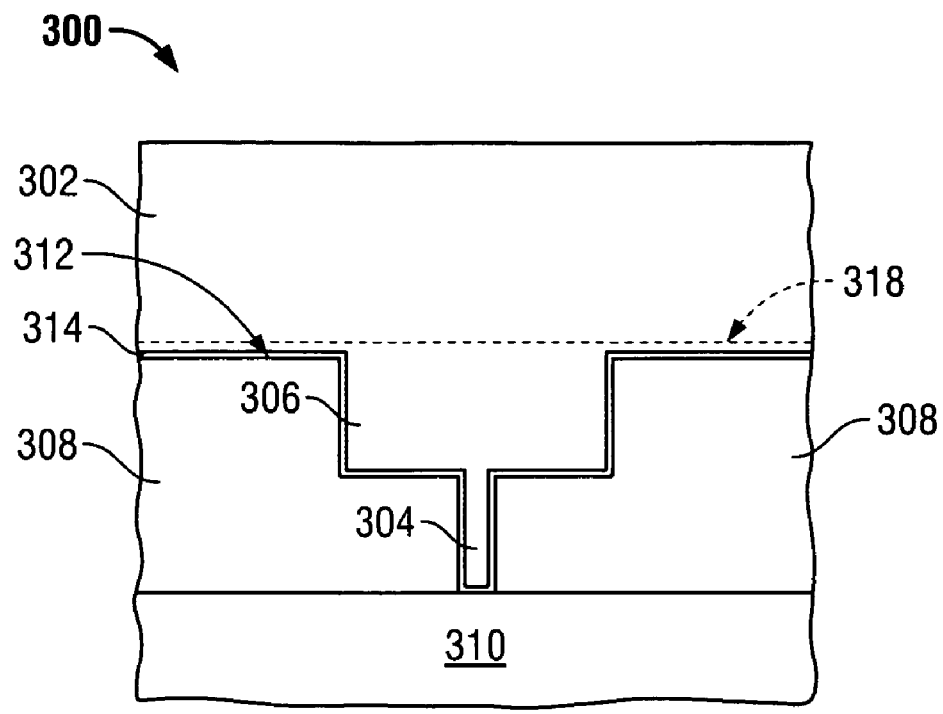
FIGS. 6A–6B depict cross-sectional views of a substrate in the formation of an interconnect according to an embodiment of the present invention.
Figure 6B:
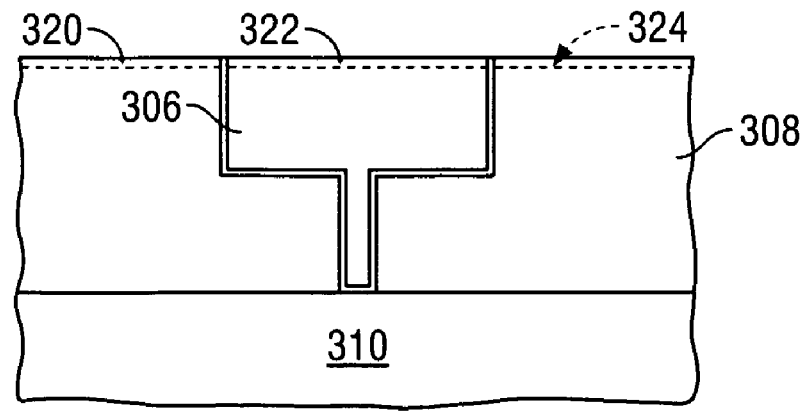

A process using the system 200 is illustrated using FIGS. 6A–6B. As shown in FIG. 6A, the substrate 300 has a via 304 and a trench 306 that are formed in an insulating layer 308 or dielectric layer disposed on a wafer 310. The insulating layer 308 has a top surface 312. A barrier layer 314 conformally coats the via 304, the trench 306 and the top surface 312 of insulating layer 308. A copper seed layer (not shown) may also be deposited on the barrier layer. The first step of the process is to deposit a planar copper layer 302 over the surface. The planar copper layer 302 is deposited in the process station 206 using the ECMD process. This planar layer, unlike the prior art shown in FIG. 1A, forms a near-flat copper surface over all features of all sizes including features with widths of several microns, even tens of microns. After the ECMD, the wafer may be cleaned in the secondary cleaning chamber 209. The following step of the process reduces the thickness of the planar copper layer by employing electrochemical etching in the electrochemical etching station 208. Before the electropolishing step, however, the wafer may be annealed in the anneal station 210. The initially thick nature of the layer 302 assures very large grain in the annealed material. Subsequent to electropolishing, depending on the thickness of the remaining planar layer, a CMP step is employed to remove rest of the conducting layers from the wafer surface. Although in this example the system 200 has only one CMP station, the system 200 may have two CMP stations to perform the two step CMP approach as described above.

As illustrated in FIG. 6A, at the electroetching stage, a top thick portion of the copper layer 302 is removed in a planar fashion down to planar surface 318. The thickness of the remaining layer can be equal or less than 2000 Å, preferably less than 1000 Å. It is understood that the thickness of the remaining layer is the thickness of the planar copper portion overlying the barrier layer on the top surface of the insulating layer. After forming the planar surface 318 the process may continue with the single step CMP process in the CMP chamber 207. As shown in FIG. 6B, using a single step CMP process, the barrier layer portion on the surface 312 together with a top portion 320 of the insulating layer 308 and a top portion 322 of the copper 302 in the trench 306 is removed in planar manner down to the planar surface 324.

In a preferred process sequence in the same system, the annealing step may be applied before the CMP step and after the ECMD step. After the ECMD step and the following rinsing and drying, the wafer may be cleaned in the secondary cleaning station. Alternatively, in yet another process sequence, after the CMP step, the substrate may be annealed in the anneal station 210. Also in this approach, the secondary cleaning step may be performed after the rinsing and drying steps that follow the CMP process.

As it will be appreciated, the above described approach has many advantages. First of all, the starting copper layer is a planar, relatively thick layer so that, once annealed, yields large grain structure. Since the layer is planar, it is feasible to reduce its thickness as shown in FIG. 6A, by utilizing a low cost electropolishing approach. Since planarization during material removal is not necessary, electropolishing can uniformly thin the layer 302 down to planar surface 318.

Electropolishing is a very low cost process compared with the CMP, which has high costs of consumables such as polishing pads and slurries. Therefore, removing most of the copper by electropolishing and leaving behind only a thin layer to be polished off by the CMP step has important economic benefits. It should be noted that electropolishing could be continued all the way to remove all the overburden copper from the surface. This, however, is more difficult and the process window is narrower. For example, over-etching by a few hundred angstroms would cause dishing into the features (vias, trenches). By leaving about 2000 Å or less copper on the surface, a single CMP step can be carried out that can yield very good dishing and erosion results, and at the same time, using small amount of consumables. Therefore, such an approach is economical and has high throughput.

Simple chemical etching process may also be used to thin down planar copper layers to a thickness less than 2000 Å. However, it is more difficult to arrest chemical reaction between the rather strong etching solution and the copper surface. Therefore, corrosion and etching of copper may continue even after etching process is stopped. In the case of electropolishing, however, as mentioned earlier, the electropolishing solutions do not appreciably etch copper surface without applied voltage. Therefore, this process is more controllable, i.e. etching stops immediately when voltage is turned off, and it also yields smooth surfaces.

Figure 7A:
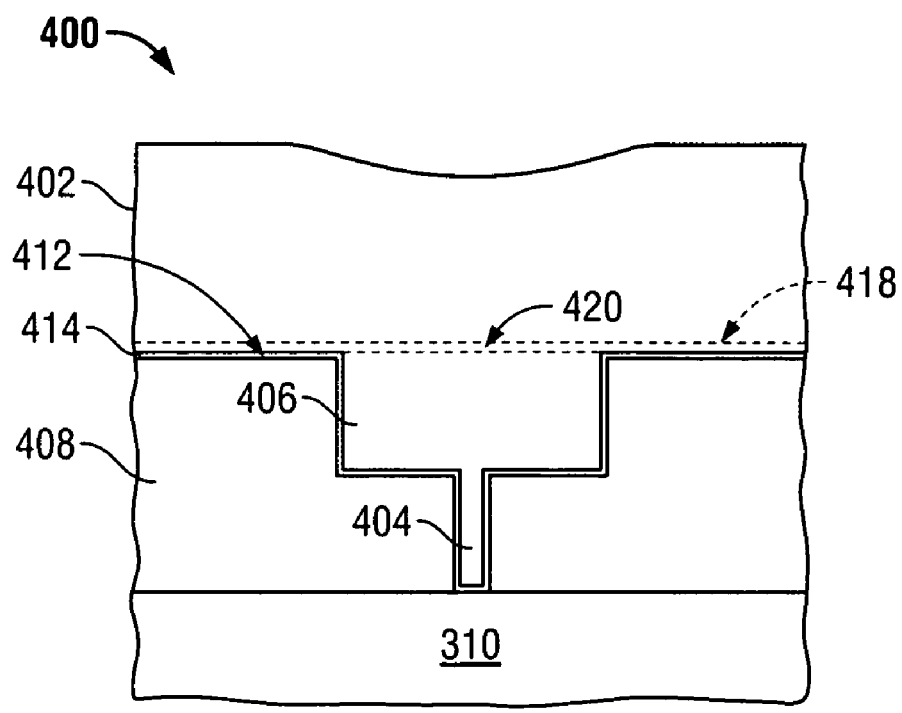
FIGS. 7A–7B depict cross-sectional views of a substrate in the formation of an interconnect according to an embodiment of the present invention.
Figure 7B:
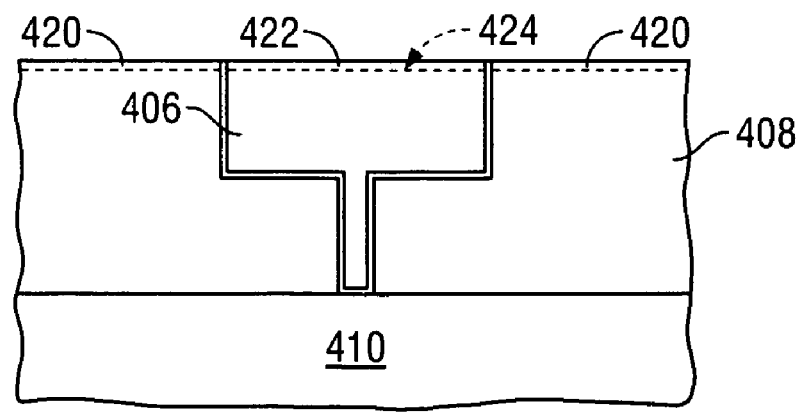

Another process using the system 200 is illustrated using FIGS. 7A–7B. In this embodiment, at a first step, a substrate 400 is plated with a copper layer 402 using a standard electrodeposition or non-contact ECMD process in the process station 206. The copper layer 402 is a conventional non-planar copper layer, which is similar to a layer deposited using conventional electrochemical deposition process. An example of a conventional electrochemical copper deposition is described in the background section in connection to FIG. 1A. The substrate 400 has a via 404 and a trench 406 that are formed in an insulating layer 408 or dielectric layer disposed on a wafer 410, and filled with copper through plating process to form the non-planar copper layer 402. The insulating layer 408 has a top surface 412. A barrier layer 414 conformally coats the via 404, the trench 406 and the top surface 412 of insulating layer 408. A copper seed layer (not shown) may also be deposited on the barrier layer. After the deposition process the substrate may be cleaned in the secondary cleaning station 209. Since the copper layer is not planar, the subsequent process needs to planarize it. In this embodiment, the substrate can be annealed in the anneal station 210 after the non-planar deposition process.

As illustrated in FIG. 7A, since the starting layer is non-planar, there is a need to planarize the surface during the material removal step. Therefore, an electrochemical mechanical etching (ECME) step is used. At the ECME stage, a top portion of the copper layer 402 is removed and planarization is achieved by the help of the mechanical action during the process leading to planar surface 418. The thickness of the remaining layer under surface 418 can be equal or less than 2000 Å, preferably less than or equal to 1000 Å. It is understood that the thickness of the remaining layer is the thickness of the planar copper portion overlying the barrier layer on the top surface of the insulating layer. After forming the planar surface 418, the process may continue with the single step CMP process in the CMP chamber 207. As shown in FIG. 7B, using a single step CMP process, the barrier layer portion on the surface 412 together with a top portion 420 of the insulating layer 408 and a top portion 422 of the copper 402 in the trench 406 is removed in planar manner down to the planar surface 424.

In one process sequence in the same system, the annealing step may be applied after the ECME step and before the CMP step. After the ECME step and following rinsing and drying, the wafer can be cleaned in the secondary cleaning station, after it is rinsed and dried in the processing station. Alternatively, in yet another process sequence, after the CMP step, the substrate is annealed in the anneal station 210. Also, in this approach, the secondary cleaning step may be performed before the annealing process.

Although, exemplary system comprising specific number of process modules have been illustrated and described above, it is understood that the above-described systems may include more or less number of processing (ECMD and ECME) and CMP process modules depending upon throughput considerations. Further, in this application, the systems are shown schematically, thus, the process modules within the systems may be varied without changing the process results of the invention.

Although various preferred embodiments and the best mode have been described in detail above, those skilled in the art will readily appreciate that many modifications of the exemplary embodiment are possible without materially departing from the novel teachings and advantages of this invention.

We claim:

1. A system for processing a conductive surface on a front surface of a wafer to form a metallic interconnect structure, comprising:
    an electrochemical mechanical processing (ECMPR) module configured to form a substantially planarized conductive layer on the front surface of the wafer;
    a chamber within the ECMPR module configured to remove conductive material from an edge region of the wafer;
    a CMP module configured to receive the wafer from the ECMPR module and polish the planarized conductive layer on the surface of the wafer to form the metallic interconnect structure; and
    a robot configured to transfer the wafer from the ECMPR module to the chemical mechanical polish (CMP) module.

2. The system according to claim 1, wherein the ECMPR module removes at least a portion of the conductive layer from the front surface of the wafer.

3. The system according to claim 1, wherein the ECMPR module deposits conductive material on the front surface of the wafer.

4. The system according the claim 3, wherein the CMP module removes at least a portion of the conductive surface on the front surface of the wafer.

5. The system according to claim 3 further comprising a cleaning module configured to clean conductive material from a back surface of the wafer, wherein the robot transfers the wafer from the ECMPR module to the cleaning module.

6. The system according to claim 5, wherein the cleaning module reduces the conductive material concentration of the back surface to less than $10^{11}$ atoms/cm$^2$.

7. The system according to claim 5, wherein the cleaning module removes the conductive material from an edge region of the wafer.

8. The system according to claim 1, wherein the CMP module removes at least a portion of the conductive layer from the front surface of the wafer.

9. The system according to claim 1, wherein the conductive layer includes a barrier layer and the CMP module removes the barrier layer from the front surface of the wafer to form the metallic interconnect structure.

10. The system according to claim 1 further comprising an anneal module configured to anneal the wafer, wherein the robot transfers the wafer from the ECMPR module to the anneal module.

11. The system according to claim 1 further comprising an anneal module configured to anneal the wafer, wherein the robot transfers the wafer from the CMP module to the anneal module.

12. The system according to claim 1, wherein the chamber rinses, cleans, and dries the wafer.

13. The system according to claim 1, wherein the ECMPR module performs a touch ECMPR process to planarize the conductive layer on the front side of the wafer.

14. The system according to claim 1, wherein the CMP module comprises a fixed abrasive pad and an abrasive-free slurry and is configured to polish the front surface of the wafer with the fixed abrasive pad and the abrasive-free slurry.

15. The system according to claim 1 further comprising another CMP module configured to polish the conductive layer and a barrier layer on the front surface of the wafer, wherein the robot transfers the wafer from the CMP module to another CMP module.

16. The system according to claim 15, wherein the another CMP module comprises a non-abrasive pad and a slurry and is configured to polish the front surface of the wafer with the non-abrasive pad and the slurry.

17. The system according to claim 15 further comprising an anneal module configured to anneal the wafer, wherein the robot transfers the wafer from the CMP module to the anneal module.

18. The system according to claim 15 further comprising an anneal module configured to anneal the wafer, wherein the robot transfers the wafer from the another CMP module to the anneal module.

19. The system according to claim 1, wherein the ECMPR module is configured to etch the conductive layer from the front surface of the wafer.

20. The system according to claim 1, wherein the conductive layer comprises copper.

21. A system for processing a conductive surface on a front surface of a wafer to form a metallic interconnect structure, comprising:
   an electrochemical mechanical processing (ECMPR) module configured to form a substantially planarized conductive layer over both the front surface and features within the front surface of the wafer, wherein the ECMPR module is configured to deposit conductive material on the front surface of the wafer;
   a CMP module configured to receive the wafer from the ECMPR module and remove at least a portion of the conductive layer from the front surface of the wafer to form the metallic interconnect structure;
   a robot configured to transfer the wafer from the ECMPR module to the chemical mechanical polish (CMP) module; and
   a chamber within the ECMPR module configured to rinse, clean, and dry the wafer.

22. A system for processing a conductive surface on a front surface of a wafer to form a metallic interconnect structure, comprising:
   an electrochemical mechanical processing (ECMPR) module configured to form a substantially planarized conductive layer over both the front surface and features within the front surface of the wafer;
   a CMP module configured to receive the wafer from the ECMPR module and remove at least a portion of the conductive layer from the front surface of the wafer to form the metallic interconnect structure;
   a robot configured to transfer the wafer from the ECMPR module to the chemical mechanical polish (CMP) module; and
   a chamber within the ECMPR module configured to remove conductive material from an edge region of the wafer.

* * * * *